United States Patent
Deogharia et al.

(10) Patent No.: US 8,666,690 B2
(45) Date of Patent: Mar. 4, 2014

(54) HETEROGENEOUS MULTI-CORE INTEGRATED CIRCUIT AND METHOD FOR DEBUGGING SAME

(75) Inventors: Amar Nath Deogharia, Noida (IN); Robert N. Ehrlich, Round Rock, TX (US); Robert A. McGowan, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 387 days.

(21) Appl. No.: 13/269,574

(22) Filed: Oct. 8, 2011

(65) Prior Publication Data

US 2013/0090887 A1 Apr. 11, 2013

(51) Int. Cl.
*G01R 27/28* (2006.01)
(52) U.S. Cl.
USPC .......................................... 702/120
(58) Field of Classification Search
USPC .......................................... 702/120
See application file for complete search history.

(56) References Cited

U.S. PATENT DOCUMENTS

| | | | |
|---|---|---|---|
| 7,111,217 B1 * | 9/2006 | Schultz | ............... 714/727 |
| 7,152,186 B2 | 12/2006 | Airaud | |
| 7,581,087 B2 | 8/2009 | John | |
| 7,665,002 B1 | 2/2010 | White | |

OTHER PUBLICATIONS

Freescale P1023 Product Literature and CodeWarrior USB TAP Product Sheet, Freescale Semiconductor, Inc., Sep. 2011.

* cited by examiner

*Primary Examiner* — Stephen Cherry
(74) *Attorney, Agent, or Firm* — Charles Bergere

(57) ABSTRACT

A heterogeneous multi-core integrated circuit includes first and second sets of processor cores and corresponding first and second test access ports (TAPs). The first and second TAPs are connected to corresponding first and second debug ports by way of corresponding first and second TAP controllers. A debug control circuit is connected between the first and second TAP controllers and the first and second debug ports. Based on external configuration signals, the debug control circuit configures the connections between the first and second TAP controllers and the first and second debug ports according to predetermined configuration modes, which allows flexibility in debugging the heterogeneous multi-core integrated circuit.

20 Claims, 3 Drawing Sheets

HETEROGENEOUS MULTI-CORE INTEGRATED CIRCUIT AND METHOD FOR DEBUGGING SAME

BACKGROUND OF THE INVENTION

The present invention relates to heterogeneous multi-core integrated circuits, and, more particularly, to a system and method for debugging heterogeneous multi-core integrated circuits.

Multi-core integrated circuits are integrated circuits with multiple processor cores. The multiple processor cores may execute the same or different functions in cohesion during operation. Certain multi-core integrated circuits include two or more processor cores with each processor core executing a different function. Such multi-core integrated circuits are known as heterogeneous multi-core integrated circuits. For example, a heterogeneous multi-core integrated circuit may include a first processor core that is a general purpose processor and a second processor core that is a digital signal processor (DSP).

Processor cores in a heterogeneous multi-core integrated circuit execute different tasks or software programs simultaneously. A debugging process is used to detect any malfunction or bugs in the processor cores or in the tasks/software programs. Debugging apparatuses are widely used for debugging multi-core integrated circuits. A debugging apparatus is designed to debug a specific kind of processor core. During debugging, the debugging apparatus is connected to debug ports of the multi-core integrated circuit. The debugging apparatus typically includes a combination of hardware, and/or software that tests the operation of a corresponding processor core. The debugging apparatus provides input data at the input debug port of the multi-core integrated circuit. Output debug data is generated at an output debug port and is received by the debugging apparatus. The output data is checked with the required specifications to detect bugs and faults within the processor cores or the tasks/software programs executed by the processor cores.

In the case of heterogeneous multi-core integrated circuits, multiple debugging apparatuses are required for testing the processor cores. Each debugging apparatus must be connected to a debug port of a corresponding one of the processor cores. The processor cores also need to be tested one at a time, which significantly increases debugging time. For testing multiple processor cores simultaneously, an individual debugging apparatus must be connected to each debug port, which increases the complexity and cost of the debugging system. Presently, heterogeneous multi-core integrated circuits allow only limited debug configurations for debugging the internal processor cores.

It would be advantageous to have a system and method for debugging a heterogeneous multi-core integrated circuit that eliminates the above mentioned shortcomings, and reduces the debugging time and cost. It further would be advantageous to have a system for debugging a heterogeneous multi-core integrated circuit that provides flexibility to use a debugging apparatus supporting a specific processor core or an integrated debugging apparatus supporting multiple processor cores.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
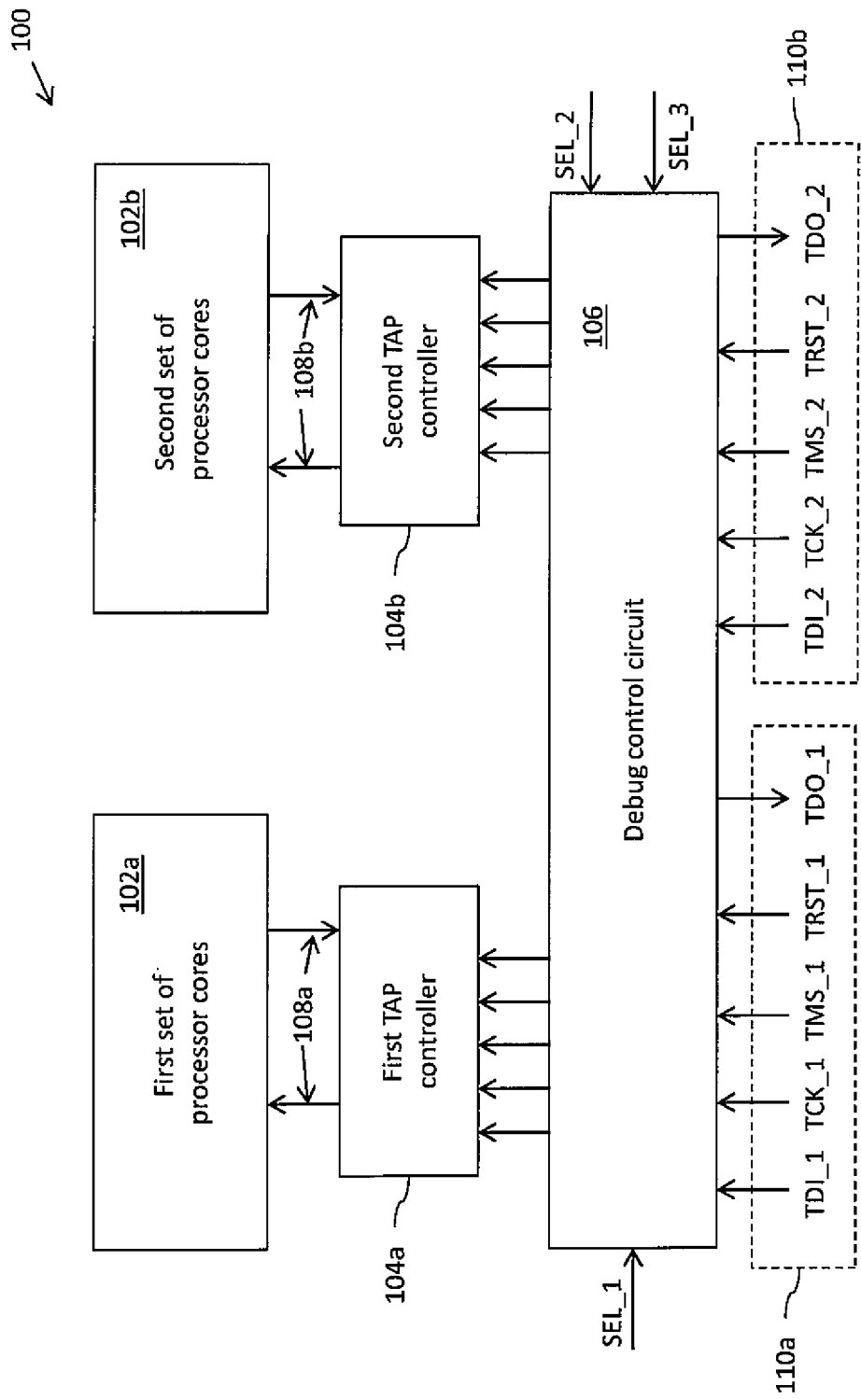
FIG. 1 is a schematic diagram illustrating a multi-core integrated circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a multi-core integrated circuit is provided. The multi-core integrated circuit includes a plurality of processor cores including a first set of processor cores and a second set of processor cores. The first and second sets of processor cores include corresponding first and second sets of test access ports (TAPs). The multi-core integrated circuit further includes a plurality of TAP controllers corresponding to the plurality of processor cores. The plurality of TAP controllers includes first and second TAP controllers connected to the first and second sets of processor cores respectively. The first and second TAP controllers connect the corresponding first and second sets of TAPs to corresponding first and second debug ports of the multi-core integrated circuit. A debug control circuit is connected between the plurality of TAP controllers and the first and second debug ports. The debug control circuit includes at least one mode select pin for receiving a configuration signal from an external debugging apparatus and generating at least one select signal. The debug control circuit configures the first and second TAP controllers and the corresponding first and second debug ports in a predetermined debugging mode, based on the at least one select signal. The debug control circuit further receives input data at one or both of the first and second debug ports from the external debugging apparatus and routes output debug data to at least one of the first and second debug ports based on debugging of at least one of the first and second sets of processor cores by the external debugging apparatus.

In another embodiment of the present invention, a method for debugging a multi-core integrated circuit is provided. The multi-core integrated circuit includes a plurality of processor cores including a first set of processor cores and a second set of processor cores. Respective test access ports (TAPs) of the first and second sets of processor cores are connected to first and second debug ports of the multi-core integrated circuit by way of corresponding first and second TAP controllers. The multi-core integrated circuit further includes a debug control circuit connected between the first and second TAP controllers and the corresponding first and second debug ports. A configuration signal is received at at least one mode select pin of the debug control circuit from an external debugging apparatus. At least one select signal is generated by the at least one mode select pin based on the configuration signal. The first and second TAP controllers and the corresponding first and second debug ports are configured in a predetermined debugging mode based on the at least one select signal. Input data is received at one or both of the first and the second debug ports from the external debugging apparatus. At least one of the first and second sets of processor cores are debugged based on the predetermined debugging mode, by the external debugging apparatus and output debug data is routed to one or both of the first and the second debug ports.

Various embodiments of the present invention provide a system and method for debugging a heterogeneous multi-core integrated circuit. The multi-core integrated circuit includes a debug control circuit that configures the connections between the TAP controllers and the corresponding debug ports. The debug control circuit allows the multi-core integrated circuit to be tested according to multiple predetermined debugging modes and providing greater flexibility to debugging operations. Also, multiple debugging apparatuses or a single integrated debugging apparatus can be connected to a single debug port, thereby reducing the debugging costs. In a first predetermined debugging mode, both of the first and second processor cores are debugged concurrently through a single debug port (for example, the first debug port). The second debug port is rendered free and can be used for other secondary data functions. In a second predetermined debugging mode, the second processor core is debugged through the first debug port, thereby rendering the second debug port free for other secondary data operations. In third and fourth predetermined debugging modes, each of the first and second processor cores are debugged through their respective debug ports. In a fifth predetermined debugging mode, both of the first and second processor cores are debugged simultaneously by connecting a debugging apparatus to each of the first and second debug ports, thereby reducing the overall debugging time.

Referring now to FIG. 1, a schematic diagram illustrating a multi-core integrated circuit 100 in accordance with an embodiment of the present invention is shown. The multi-core integrated circuit 100 includes a plurality of processor cores including a first set of processor cores 102a and a second set of processor cores 102b, a plurality of TAP controllers 104 including first and second TAP controllers 104a and 104b, and a debug control circuit 106. In various embodiments of the present invention, the multi-core integrated circuit 100 may be a heterogeneous multi-core integrated circuit. The multi-core integrated circuit 100 may be used in electronic devices including mobile or handheld devices, and small and pico-metro cells.

The first set of processor cores 102a may include multiple general purpose processor cores and will henceforth be collectively referred to as a first processor core 102a. The second set of processor cores 102b may include multiple digital signal processors and will henceforth be collectively referred to as a second processor core 102b. Each of the first and the second processor cores 102a and 102b include corresponding first and second test access ports (TAPs) 108a and 108b (collectively referred to as TAPs 108) for accessing the processor cores for debugging. The first TAP 108a is configured to access the first processor core 102a and the second TAP 108b is configured to access the second processor core 102b for debugging. In various embodiments of the present invention, the TAPs 108 may be any suitable serial/parallel data interfaces.

The first and second TAP controllers 104a and 104b (collectively referred to as TAP controllers 104) are connected between the corresponding first and second TAPs 108a and 108b and the corresponding debug ports 110a and 110b (collectively referred to as debug ports 110). The TAP controllers 104 are configured to select one of the first and second processor cores 102a and 102b for debugging. The TAP controllers 104a and 104b include internal multiplexers or muxes (not shown) that select respective first and second processor cores 102 and 102b for debugging. Further, each of the TAP controllers 104 includes a set of data and instruction registers (not shown). The set of data and instruction registers stores and processes instructions corresponding to the various functions of the TAP controllers 104.

In various embodiments of the present invention, the debug ports 110 may be IEEE 1149.1 Standard Test Access Port and Boundary-Scan interfaces and each debug port 110 includes a test data in (TDI) interface, a test data out (TDO) interface, a test clock (TCK) interface, a test mode select (TMS) interface and an optional test reset (TRST) interface. Thus, the first debug port 110a includes TDI_1, TDO_1, TCK_1, TMS_1, and TRST_1 interfaces and the second debug port 110b includes TDI_2, TDO_2, TCK_2, TMS_2, and TRST_2 interfaces.

An external debugging apparatus may be connected to one or both of the first and second debug ports 110a and 110b, for debugging the first and second processor cores 102a and 102b, respectively. In various embodiments of the present invention, the debugging apparatus may be any suitable debugging tool used commercially including tools provided by CodeWarrior™, Mentor Graphics™ and the like.

The debug control circuit 106 is connected between the TAP controllers 104 and the debug ports 110. The debug control circuit 106 is capable of receiving a configuration signal from the external debugging apparatus and configuring the connections between the TAP controllers 104 and corresponding debug ports 110, according to a predetermined debugging mode. Based on the configuration signal, the debug control circuit 106 selects a predetermined configuration mode and allows debugging of one or both of the first and second processor cores 102a and 102b.

The debug control circuit 106 is further configured to receive input data at the input pins of one or both of the first and second debug ports 110a and 110b (pins TDI_1 or TDI_2). The external debugging apparatus performs debugging operations on one or both of the first and second processor cores 102a and 102b. The debug control circuit 106 further routes output debug data to the output pins of one or both of the first and second debug ports 110a and 110b (pins TDO_1 or TDO_2).

In various embodiments of the present invention, the multi-core integrated circuit 100 may be debugged in multiple debugging modes as explained in the foregoing. In a first predetermined debugging mode, the debug control circuit 106 connects the first TAP controller 104a and the second TAP controller 104b in a daisy chain mode and enables debugging of the first and second processor cores 102a and 102b concurrently through the first debug port 110a. In a second predetermined debugging mode, the debug control circuit 106 connects the first debug port 110a to the second TAP controller 104b for debugging the second processor core 102b through the first debug port 110a. In a third predetermined debugging mode, the debug control circuit 106 connects the first debug port 110a to the first TAP controller 104a for debugging the first processor core 102a and for performing a boundary scan of the multi-core integrated circuit 100. In a fourth predetermined debugging mode, the debug control circuit 106 connects the second debug port 110b to the second TAP controller 104b for debugging the second processor core 102b through the second debug port 110b. In a fifth predetermined debugging mode, the debug control circuit 106 connects the first and second debug ports 110a and 110b to the respective first and second TAP controllers 104a and 104b for debugging the first and second processor cores 102a and 102b, respectively. The functioning and the internal circuitry of the debug control circuit 106 have been explained in detail in conjunction with FIG. 2.

Figure 2:
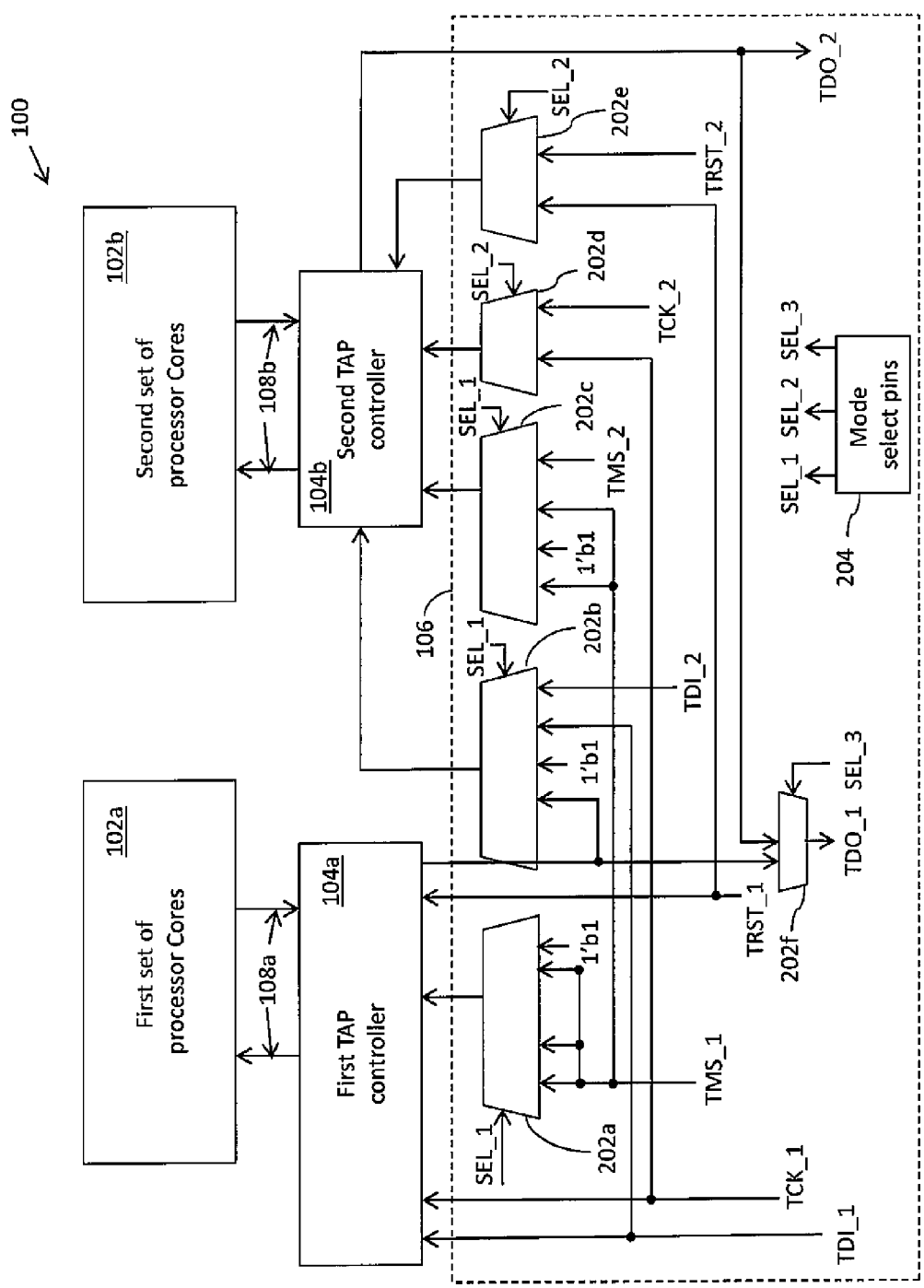
FIG. 2 is a detailed schematic diagram illustrating the multi-core integrated circuit of FIG. 1 in accordance with an embodiment of the present invention.

Referring now to FIG. 2, a detailed schematic diagram illustrating the multi-core integrated circuit 100 of FIG. 1 in accordance with an embodiment of the present invention is shown. The debug control circuit 106 includes a plurality of muxes including a first mux 202a, a second mux 202b, a third mux 202c, a fourth mux 202d, a fifth mux 202e, and a sixth mux 202f. The debug control circuit 106 further includes a plurality of mode select pins 204 that receive the configuration signal from the external debugging apparatus and generate first, second and third select signals (SEL_1, SEL_2, and SEL_3 signals respectively). The input lines of the first mux 202a are connected to the TMS_1 interface and the output line of the first mux 202a is connected to the first TAP controller 104a. The input lines of the second mux 202b are connected to the TDO_1, TDI_1, and TDI_2 interfaces. The input lines of the third mux 202c are connected to the TMS_1 and TMS_2 interfaces. The input lines of the fourth mux 202d are connected to the TCK_1 and TCK_2 interfaces. The input lines of the fifth mux 202e are connected to the TRST_1 and TRST_2 interfaces. One input line of each of the muxes 202a-202c is further connected to logic "1" (1'b1). The output lines of the muxes 202b-202e are connected to the second TAP controller 104b. The TDO_1 and TDO_2 interfaces are multiplexed using the sixth mux 202f. The first, second and third muxes 202a, 202b, and 202c receive the SEL_1 signal at their respective select inputs. The fourth and fifth muxes 202d and 202e receive the SEL_2 signal at their select inputs and the sixth mux 202f receives the SEL_3 signal at its select input.

In operation, one or more external debugging apparatuses are connected to one or both of the first and second debug ports 110a and 110b, depending on the predetermined debugging mode. Initially, the external debugging apparatus sends a configuration signal to the debug control circuit 106. The external debugging apparatus may include an onboard circuit, such as a jumper or a switch that transmits a configuration signal to the mode select pins 204 and the mode select pins 204 generate the SEL_1, SEL_2 and SEL_3 signals. Based on the SEL_1, SEL_2 and SEL_3 signals, the debug control circuit 106 sets the TAP controllers 104 in one of the many predetermined debugging modes.

In the first predetermined debugging mode, the external debugging apparatus is connected to the first debug port 110a. The onboard circuit transmits the corresponding configuration signal to the mode select pins 204 which generate the SEL_1, SEL_2, and SEL_3 signals and the debug control circuit 106 configures the first and second TAP controllers 104a and 104b in a daisy chain mode. The external debugging apparatus provides input data at the TDI_1 interface and debugs the first processor core 102a. The output debug data at the TDO_1 interface is provided as an input to the second TAP controller 104b through the second mux 202b, for debugging the second processor core 102b. The output debug data of the second processor core 102b is received at the TDO_2 interface and tapped at the output of the sixth mux 202f. Thus, a single debugging apparatus can be used for debugging both the first and second processor cores 102a and 102b through the first debug port 110a. The second debug port 110b remains unused and can be used for other secondary data operations.

In the second predetermined debugging mode, the external debugging apparatus is connected to the first debug port 110a. The onboard circuit transmits the corresponding configuration signal to the mode select pins 204 which generate the SEL_1, SEL_2, and SEL_3 signals and the debug control circuit 106 connects the first debug port 110a to the second TAP controller 104b, through the muxes 202b-202e. The external debugging apparatus provides input data at the TDI_1 interface. The input data is provided to the second TAP controller 104b through the second mux 202b for debugging the second processor core 102b. The output debug data of the second processor core 102b is received at the TDO_2 interface and tapped at the output of the sixth mux 202f. Thus, the second processor core 102b is debugged through the first debug port 110a and the second debug port 110b remains unused and can be used for other secondary data operations.

In the third predetermined debugging mode, the external debugging apparatus is connected to the first debug port 110a. The onboard circuit sends the corresponding configuration signal to the mode select pins 204, which generate the SEL_1, SEL_2, and SEL_3 signals and the debug control circuit 106 connects the first debug port 110a to the first TAP controller 104a. The external debugging apparatus provides input data at the TDI_1 interface for debugging the first processor core 102a. The output debug data of the first processor core 102a is received at the TDO_1 interface and tapped at the output of the sixth mux 202f. This mode is also used to perform a boundary scan of the multi-core integrated circuit 100. Similarly, in the fourth predetermined debugging mode, the external debugging apparatus is connected to the second debug port 110b. The onboard circuit transmits the corresponding configuration signal to the mode select pins 204, which generate the SEL_1, SEL_2, and SEL_3 signals and the debug control circuit 106 connects the second debug port 110b to the second TAP controller 104b, through the muxes 202b-202e. The external debugging apparatus provides input data at the TDI_2 interface. The input data is provided to the second TAP controller 104b through the second mux 202b for debugging the second processor core 102b. The output debug data of the second processor core 102b is received at the TDO_2 interface.

In the fifth predetermined debugging mode, a first debugging apparatus is connected to the first debug port 110a and a second debugging apparatus is connected to the second debug port 110b. The onboard circuit transmits the corresponding configuration signal to the mode select pins 204 which generate the SEL_1, SEL_2, and SEL_3 signals and the debug control circuit 106 connects the first debug port 110a to the first TAP controller 104a and the second debug port 110b to the second TAP controller 104b. The first debugging apparatus provides input data at the TDI_1 interface for debugging the first processor core 102a. The output debug data of the first processor core 102a is received at the TDO_1 interface and tapped at the output of the sixth mux 202f. Likewise, the second debugging apparatus provides input data at the TDI_2 interface through the second mux 202b for debugging the second processor core 102b. The output debug data of the second processor core 102b is received at the TDO_2 interface. Thus, both the first and second processor cores 102a and 102b are debugged simultaneously using two debugging apparatuses, thereby reducing the debugging time.

Figure 3:
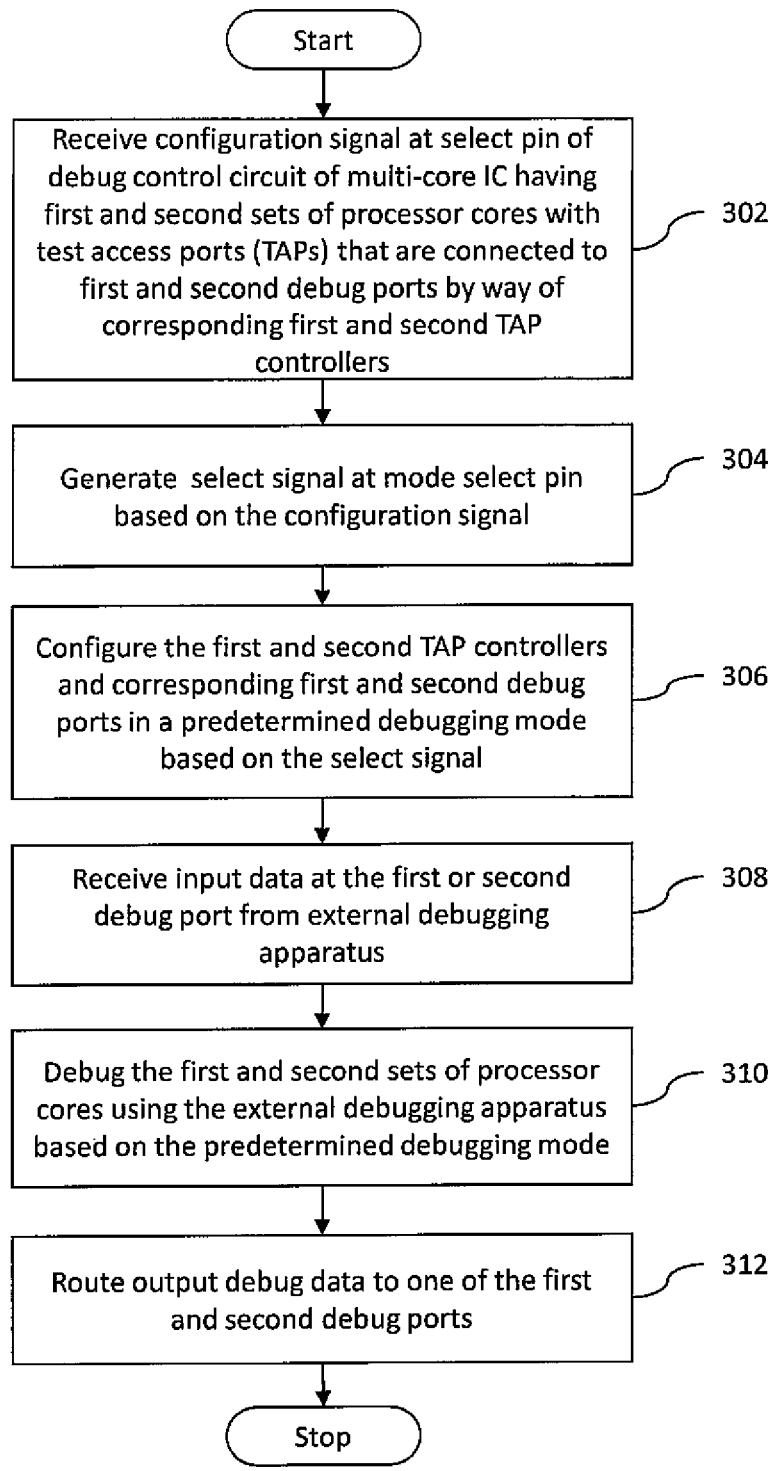
FIG. 3 is a flow diagram illustrating a method for debugging a multi-core integrated circuit in accordance with an embodiment of the present invention.

Referring now to FIG. 3, a flow chart illustrating a method for debugging the multi-core integrated circuit 100 in accordance with an embodiment of the present invention is shown. Various steps of the flowchart have been explained in conjunction with FIGS. 1 and 2. At step 302, a configuration signal is received at the mode select pins 204. The configuration signal may be generated by an onboard circuit, such as a jumper or a switch in the external debugging apparatus. At step 304, the SEL_1, SEL_2, and SEL_3 signals are generated by the mode select pins 204, based on the received configuration signal. At step 306, the TAP controllers 104 and the corresponding debug ports 100 are configured in a predetermined debugging mode by the debug control circuit 106, based on the SEL_1, SEL_2 and SEL_3 signals. The debug control circuit 106 configures the connections between the first and second TAP controllers 104a and 104b and corresponding first and second debug ports 110a and 110b.

At step 308, the input data is received at one (or both) of the first and second debug ports 110a and 110b from the external debugging apparatus, based on the predetermined debugging mode. At step 310, one or both of the processor cores 102a and 102b are debugged by the external debugging apparatus based on the predetermined debugging mode. The various predetermined debugging modes (first, second, third, fourth and fifth predetermined debugging modes) have been explained above in detail in conjunction with FIG. 2. At step 312, output debug data is routed by the debug control circuit 106 to one or both of the first and second debug ports 110a and 110b (depending on the predetermined debugging mode). The output debug data is tapped at the output of the sixth mux 202f or the TDO_2 interface.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A multi-core integrated circuit, comprising:
   a plurality of processor cores including a first set of processor cores and a second set of processor cores, wherein the first and second sets of processor cores include corresponding first and second sets of test access ports (TAPs);
   a plurality of TAP controllers corresponding to the plurality of processor cores, wherein the plurality of TAP controllers includes first and second TAP controllers connected to the first and second sets of processor cores respectively, and wherein the first and second TAP controllers connect the corresponding first and second sets of TAPs to corresponding first and second debug ports of the multi-core integrated circuit; and
   a debug control circuit connected between the plurality of TAP controllers and the first and second debug ports, wherein the debug control circuit includes at least one mode select pin for receiving a configuration signal from an external debugging apparatus and generating at least one select signal, wherein the debug control circuit configures the first and second TAP controllers and the corresponding first and second debug ports in a predetermined debugging mode, based on the at least one select signal, and receives input data at at least one of the first debug port and the second debug port from the external debugging apparatus, and routes output debug data to at least one of the first and second debug ports, based on debugging of at least one of the first and second sets of processor cores by the external debugging apparatus.

2. The multi-core integrated circuit of claim 1, wherein the first and second debug ports each comprise a test data in (TDI) interface, a test data out (TDO) interface, a test clock (TCK) interface, a test mode select (TMK) interface and an optional test reset (TRST) interface.

3. The multi-core integrated circuit of claim 1, wherein the predetermined debugging mode comprises connecting the first and second TAP controllers in a daisy chain mode for debugging the first and the second sets of processor cores concurrently through the first debug port.

4. The multi-core integrated circuit of claim 1, wherein the predetermined debugging mode comprises connecting the first debug port to the second TAP controller for debugging the second set of processor cores through the first debug port.

5. The multi-core integrated circuit of claim 1, wherein the predetermined debugging mode comprises connecting the first debug port to the first TAP controller for performing at least one of a boundary scan of the multi-core integrated circuit and debugging of the first set of processor cores.

6. The multi-core integrated circuit of claim 1, wherein the predetermined debugging mode comprises connecting the second debug port to the second TAP controller for debugging the second set of processor cores.

7. The multi-core integrated circuit of claim 1, wherein the debug control circuit receives the input data at each of the first and second debug ports.

8. The multi-core integrated circuit of claim 7, wherein the predetermined debugging mode comprises connecting the first and second debug ports to the respective first and second TAP controllers for debugging the respective first and second sets of processor cores concurrently.

9. The multi-core integrated circuit of claim 1, wherein the debug control circuit includes a set of multiplexers connected between the at least one select pin, the first and second debug ports and the first and second TAP controllers, for configuring the connections between the first and second debug ports and the respective first and second TAP controllers, based on at least one of the predetermined debugging mode and the at least one select signal.

10. The multi-core integrated circuit of claim 1, wherein each of the first and second TAP controllers include a set of data and instruction registers for storing and processing functions associated with the first and second TAP controllers.

11. The multi-core integrated circuit of claim 1, wherein the multi-core integrated circuit is a heterogeneous multi-core integrated circuit.

12. The multi-core integrated circuit of claim 1, wherein the first set of processor cores are general purpose processors.

13. The multi-core integrated circuit of claim 1, wherein the second set of processor cores are digital signal processors (DSPs).

14. A method for debugging an multi-core integrated circuit, wherein the multi-core integrated circuit includes a plurality of processor cores including a first set of processor cores and a second set of processor cores, and wherein respective test access ports (TAPs) of the first and second sets of processor cores are connected to first and second debug ports of the multi-core integrated circuit by way of corresponding first and second TAP controllers respectively, and wherein the multi-core integrated circuit further includes a debug control circuit connected between the first and second TAP controllers and the corresponding first and second debug ports, the method comprising:
   receiving a configuration signal at at least one mode select pin of the debug control circuit, from an external debugging apparatus;
   generating at least one select signal by the at least one mode select pin, based on the configuration signal;
   configuring the first and second TAP controllers and the corresponding first and second debug ports in a predetermined debugging mode, based on the at least one select signal;

receiving input data at at least one of the first debug port and the second debug port from the external debugging apparatus;

debugging at least one of the first and second sets of processor cores by the external debugging apparatus, based on the predetermined debugging mode; and routing output debug data to at least one of the first and second debug ports.

15. The method of claim 14, wherein the predetermined debugging mode comprises connecting the first and second TAP controllers in a daisy chain mode for debugging the first and the second sets of processor cores concurrently through the first debug port.

16. The method of claim 14, wherein the predetermined debugging mode comprises connecting the first debug port to the second TAP controller for debugging the second set of processor cores through the first debug port.

17. The method of claim 14, wherein the predetermined debugging mode comprises connecting the first debug port to the first TAP controller for performing at least one of a boundary scan of the multi-core integrated circuit and debugging of the first set of processor cores.

18. The method of claim 14, wherein the predetermined debugging mode comprises connecting the second debug port to the second TAP controller for debugging the second set of processor cores.

19. The method of claim 14, further comprising receiving the input data at each of the first and second debug ports.

20. The method of claim 19, wherein the predetermined debugging mode comprises connecting the first and second debug ports to the respective first and second TAP controllers for debugging the first and second sets of processor cores concurrently.

* * * * *